(12) United States Patent
Kim

(10) Patent No.: US 9,336,840 B2
(45) Date of Patent: May 10, 2016

(54) SEMICONDUCTOR APPARATUS CAPABLE OF COMPENSATING FOR DATA OUTPUT TIME AND METHOD FOR CONTROLLING THE SAME

(71) Applicant: SK hynix Inc., Icheon-si Gyeonggi-do (KR)

(72) Inventor: Sung Ho Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/536,011

(22) Filed: Nov. 7, 2014

(65) Prior Publication Data

US 2016/0042776 A1 Feb. 11, 2016

(30) Foreign Application Priority Data

Aug. 8, 2014 (KR) ........................ 10-2014-0102522

(51) Int. Cl.
*G11C 7/00* (2006.01)
*G11C 7/22* (2006.01)
*G11C 5/14* (2006.01)

(52) U.S. Cl.
CPC .. *G11C 7/22* (2013.01); *G11C 5/14* (2013.01); *G11C 5/147* (2013.01)

(58) Field of Classification Search
CPC .............. G11C 7/22; G11C 7/10; G11C 5/14; G11C 5/06; G11C 5/147; G11C 11/4063; G11C 11/4074
USPC ............. 365/191, 193, 233.13, 236, 241, 227
See application file for complete search history.

(56) References Cited

U.S. PATENT DOCUMENTS

| 7,581,127 | B2* | 8/2009 | Rajan | G11C 5/04 713/300 |
| 8,667,312 | B2* | 3/2014 | Rajan | G11C 5/147 713/320 |
| 2012/0201088 | A1* | 8/2012 | Rajan | G11C 11/4063 365/193 |
| 2014/0192583 | A1* | 7/2014 | Rajan | G11C 7/10 365/63 |

FOREIGN PATENT DOCUMENTS

KR 1020090048084 A 5/2009

* cited by examiner

*Primary Examiner* — Gene Auduong
(74) *Attorney, Agent, or Firm* — William Park & Associates Ltd.

(57) ABSTRACT

A semiconductor apparatus may include a base die and a plurality of core dies stacked above the base die. Each of the core dies may be configured to output a strobe signal in response to a read command, and the base die may be configured to make remaining data output times correspond to any one data output time among respective data output times of the plurality of core dies, in response to the read command and the strobe signal.

21 Claims, 6 Drawing Sheets

SEMICONDUCTOR APPARATUS CAPABLE OF COMPENSATING FOR DATA OUTPUT TIME AND METHOD FOR CONTROLLING THE SAME

CROSS-REFERENCES TO RELATED APPLICATION

The present application claims priority under 35 U.S.C. §119(a) to Korean application number 10-2014-0102522, filed on Aug. 8, 2014, in the Korean Intellectual Property Office, which is incorporated herein by reference in its entirety.

BACKGROUND

1. Technical Field

Various embodiments generally relate to a semiconductor apparatus, and more particularly, to a semiconductor apparatus capable of compensating for a data output time and a method for controlling the same.

2. Related Art

Recently, in semiconductor technologies, a scheme implements a plurality of dies stacked and signal transmissions are sent through vias. For example, through-silicon vias (TSV) have been used.

Processing characteristics may vary from die to die, even on a single wafer. That is to say, a process may be quickly performed in the center region of a wafer and may be slowly performed in the peripheral region of the wafer.

Such a processing characteristic differences may cause a difference in the data output times of the respective dies. This may lead to the degradation of a data output operation, that is, a read operation, and cause the occurrence of a serious operational error.

SUMMARY

In an embodiment, a semiconductor apparatus may include a base die and a plurality of core dies. The core dies may be stacked above the base die, wherein each of the core dies may be configured to output a strobe signal in response to a read command. The base die may be configured to make remaining data output times correspond to any one data output time among respective data output times of the plurality of core dies, in response to the read command and the strobe signal.

In an embodiment, a semiconductor apparatus may include a base die and a plurality of core dies. The plurality of core dies may be stacked above the base die. Each of the plurality of core dies may be configured to output a strobe signal for notifying a data output timing, in response to a test signal and a read command. The base die may be configured to generate a control signal for notifying whether any one data output time and the remaining data output times among respective data output times of the plurality of core dies, which are detected in response to the read command and the strobe signal, correspond to each other.

In an embodiment, a semiconductor apparatus may include a base die and a plurality of core dies. The plurality of core dies may be stacked above the base die. Each of the plurality of core dies may be configured to output a strobe signal for notifying a data output timing, in response to a test signal and a read command. The base die may be configured to generate control codes corresponding to a difference value between any one data output time and the remaining data output times among respective data output times of the plurality of core dies. The plurality of core dies may be detected in response to the read command and the strobe signal.

In an embodiment, a method for controlling a semiconductor apparatus including a base die and a plurality of core dies. The plurality of core dies may be stacked above the core die and the method may include measuring sequentially data output times of the plurality of core dies, and storing a maximum value among the measured data output times. The method may include controlling independently respective internal bias levels of the plurality of core dies according to differences between the respective data output times of the plurality of core dies and the maximum value.

In an embodiment, the measuring of data output times may include inputting a read command to the plurality of core dies. The measuring of data output times may include counting times from a timing when the read command is inputted to timings when strobe signals for notifying data output timings are outputted from the plurality of core dies.

In an embodiment, the controlling may include lowering stepwise reference voltages of core dies of which data output times are shorter than the maximum value. The controlling may include repeating the lowering until the data output times of the core dies shorter than the maximum value become equal to the maximum value.

In an embodiment, the controlling may be performed by controlling the respective reference voltages of the plurality of core dies according to differences between the respective data output times of the plurality of core dies and the maximum value.

In an embodiment, the controlling may include lowering stepwise reference voltages of core dies of which data output times are shorter than the maximum value, by using the test signal. The controlling may include storing the test signal when each of the data output times of the core dies which are shorter than the maximum value becomes equal to the maximum value, as the reference codes.

In an embodiment, the controlling may be performed by storing a value that results from subtracting each of differences between the data output times of the core dies shorter than the maximum value and the maximum value, from a value of the test signal, as the reference codes.

In an embodiment, a semiconductor apparatus may include a base die and a plurality of core dies. The plurality of core dies electrically coupled to the base die through vias. Each of the core dies may be configured to output a strobe signal in response to a read command. The base die may be configured to make remaining data output times correspond to any one data output time among respective data output times of the plurality of core dies, in response to the read command and the strobe signal.

DETAILED DESCRIPTION

Hereinafter, a semiconductor apparatus capable of compensating for a data output time and a method for controlling the same will be described below with reference to the accompanying drawings through various examples of embodiments.

Various embodiments may be directed to a semiconductor apparatus capable of compensating for a data output time difference of stacked dies, and a method for controlling the same.

Figure 1:
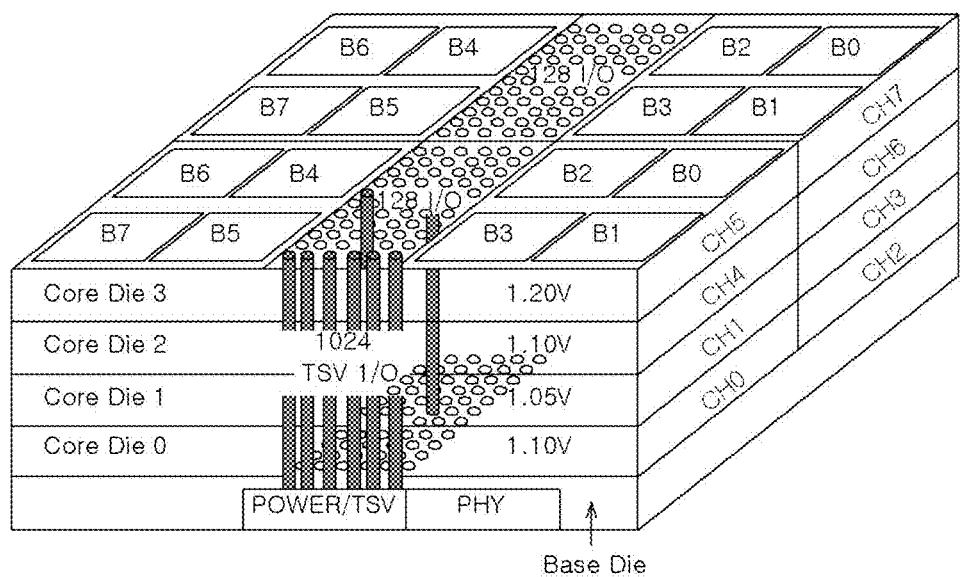
FIG. 1 is a perspective view illustrating a representation of an example of a semiconductor apparatus in accordance with an embodiment.

As illustrated in FIG. 1, in a semiconductor apparatus in accordance with an embodiment, a plurality of dies may be stacked.

The plurality of dies may include a base die Base Die and core dies Core Die 0 to Core Die 3.

The base die Base Die may include a PHY region. The base die Base Die may include various logic circuits for performing an interfacing function between an exterior of the semiconductor apparatus and the core dies Core Die 0 to Core Die 3. The base die Base Die may include a POWER/TSV region.

The core dies Core Die 0 to Core Die 3 may include memory regions and circuit configurations for processing data.

Each of the core dies Core Die 0 to Core Die 3 may include pluralities of memory banks B0 to B7 and input/output logics 128 I/O.

The respective core dies Core Die 0 to Core Die 3 may be distinguished by channels, based on left and right memory banks B0 to B7 (distinguishment is made by using the terms, left and right, for the sake of convenience in explanation). For example, the core die Core Die 0 may be divided into channels CH0 and CH2, and the core die Core Die 3 may be divided into channels CH5 and CH7. For example, the core die Core Die 1 may be divided into channels CH1 and CH3, and core die Core Die 2 may be divided into channels CH4 and CH6.

The base die Base Die and the core dies Core Die 0 to Core Die 3 may be electrically coupled such that signal transmission is implemented through vias, for example, through-silicon vias (TSV).

Before making subsequent descriptions, it is to be noted that, in an embodiment, the base die Base Die may be configured to make the remaining data output times correspond to any one, that is, the longest data output time, among the data output times of the respective core dies Core Die 0 to Core Die 3.

A method for making the remaining data output times correspond to the longest data output time may be performed through control of the internal bias levels of core dies.

The operation speed of a semiconductor apparatus may be quick as an internal bias level is high and may be slow as an internal bias level is low.

Internal bias levels may be controlled according to the reference levels of core dies.

For example, by controlling the reference voltage levels of the core dies Core Die 0 to Core Die 3 to 1.10V, 1.05V, 1.10V and 1.20V (which are taken as an example and of which actual control values may be different) as illustrated in FIG. 1, internal bias levels may be controlled, and accordingly, it may be possible to cause all the core dies Core Die 0 to Core Die 3 to have the same data output time with respect to a read command.

Figure 2:
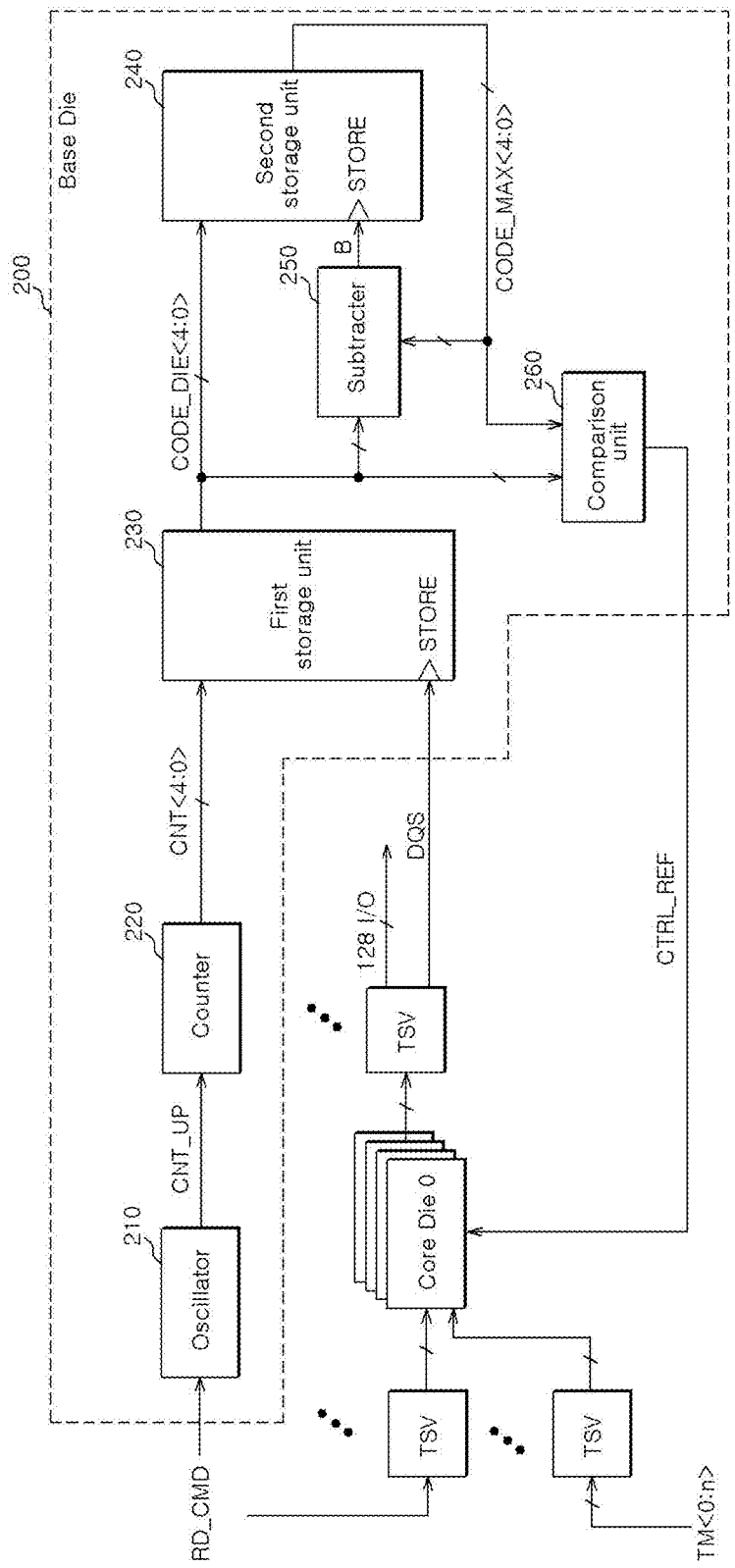
FIG. 2 is a block diagram illustrating a representation of an example of the internal configuration of a semiconductor apparatus in accordance with an embodiment.

Referring to FIG. 2, a semiconductor apparatus 101 in accordance with an embodiment may include a base die 200 and core dies Core Die 0 to Core Die 3.

The base die 200 may be configured to generate a control signal CTRL_REF for notifying whether any one, that is, the longest data output time, among the data output times of the core dies Core Die 0 to Core Die 3 detected in response to a read command RD_CMD and a strobe signal DQS, corresponds to the remaining data output times.

The core dies Core Die 0 to Core Die 3 may be configured to output data through input/output lines 128 I/O. The data may be output through the input/output lines 128 I/O in response to the read command RD_CMD.

Each of the core dies Core Die 0 to Core Die 3 may be configured to output the strobe signal DQS for notifying a data output time, according to the reference voltage controlled by test signals TM<0:n>, in response to the read command RD_CMD.

Each of the core dies Core Die 0 to Core Die 3 may generate a reference voltage with a level corresponding to reference codes in a normal operation. Each of the core dies Core Die 0 to Core Die 3 may generate a reference voltage with a level corresponding to the value of the test signals TM<0:n> in a test operation.

The reference codes may be stored in a fuse set.

Each of the core dies Core Die 0 to Core Die 3 may be configured to update the corresponding value of the test signals TM<0:n> at the activation timing of the control signal CTRL_REF, as the reference codes.

The base die 200 and the core dies Core Die 0 to Core Die 3 may be electrically coupled such that signal transmission is implemented through vias, for example, through-silicon vias (TSV).

The base die 200 may include an oscillator 210, a counter 220, and a first storage unit 230. The base die 200 may include a second storage unit 240, a subtracter 250, and a comparison unit 260.

The oscillator 210 may be configured to output the oscillation signal. The oscillation signal may be generated in response to the read command RD_CMD, as a count-up signal CNT_UP.

The counter 220 may be configured to change, that is, increase the value of time count signals CNT<4:0> in response to the count-up signal CNT_UP.

The counter 220 may be configured to increase the value of the time count signals CNT<4:0> each time the count-up signal CNT_UP is generated.

The first storage unit 230 may be configured to store the time count signals CNT<4:0> as first codes CODE_DIE<4:0>. The time count signals CNT<4:0> may be stored as first codes CODE_DIE<4:0> in response to the input signal of a control terminal STORE. The input signal of the control terminal may be the strobe signal DQS.

The first storage unit 230 may be configured to store the time count signals CNT<4:0> at a timing when the strobe signal DQS is generated, that is, the transition (for example, the rising edge) of the strobe signal DQS occurs, and the first storage unit 230 outputs stored values as the first codes CODE_DIE<4:0>.

The first codes CODE_DIE<4:0> are digital values that result from converting the data output time of each of the core dies Core Die 0 to Core Die 3, that is, a time that passes from a timing when the read command RD_CMD is inputted to a timing when the transition of the strobe signal DQS occurs.

The second storage unit 240 may be configured to update second codes CODE_MAX<4:0>. The second codes CODE_MAX<4:0> may be updated with the currently inputted value of the first codes CODE_DIE<4:0> in response to the input signal of a control terminal STORE. The input signal may be a subtraction result signal B.

The second storage unit 240 may retain the current second codes CODE_MAX<4:0> in the examples where the subtraction result signal B is deactivated (for example, when B is at a logic low level).

The second storage unit 240 may update the second codes CODE_MAX<4:0> with the currently inputted value of the first codes CODE_DIE<4:0> in the examples where the subtraction result signal B is activated (for example, when B is at a logic high level).

The subtracter 250 may be configured to subtract the first codes CODE_DIE<4:0> from the second codes CODE_MAX<4:0>, and generate the subtraction result signal B.

The subtracter 250 may be configured to output a borrowed value as the subtraction result signal B in the examples where the value of the first codes CODE_DIE<4:0> is greater than the value of the second codes CODE_MAX<4:0>, in the course of subtracting the first codes CODE_DIE<4:0> from the second codes CODE_MAX<4:0> starting from the most significant bit.

The second codes CODE_MAX<4:0> may be a maximum value among the first codes CODE_DIE<4:0> according to the respective core dies Core Die 0 to Core Die 3.

The comparison unit 260 may be configured to compare the first codes CODE_DIE<4:0> and the second codes CODE_MAX<4:0>, and generate the control signal CTRL_REF.

The comparison unit 260 may be configured to activate the control signal CTRL_REF when the value of the first codes CODE_DIE<4:0> and the value of the second codes CODE_MAX<4:0> do not correspond to each other.

Figure 3:
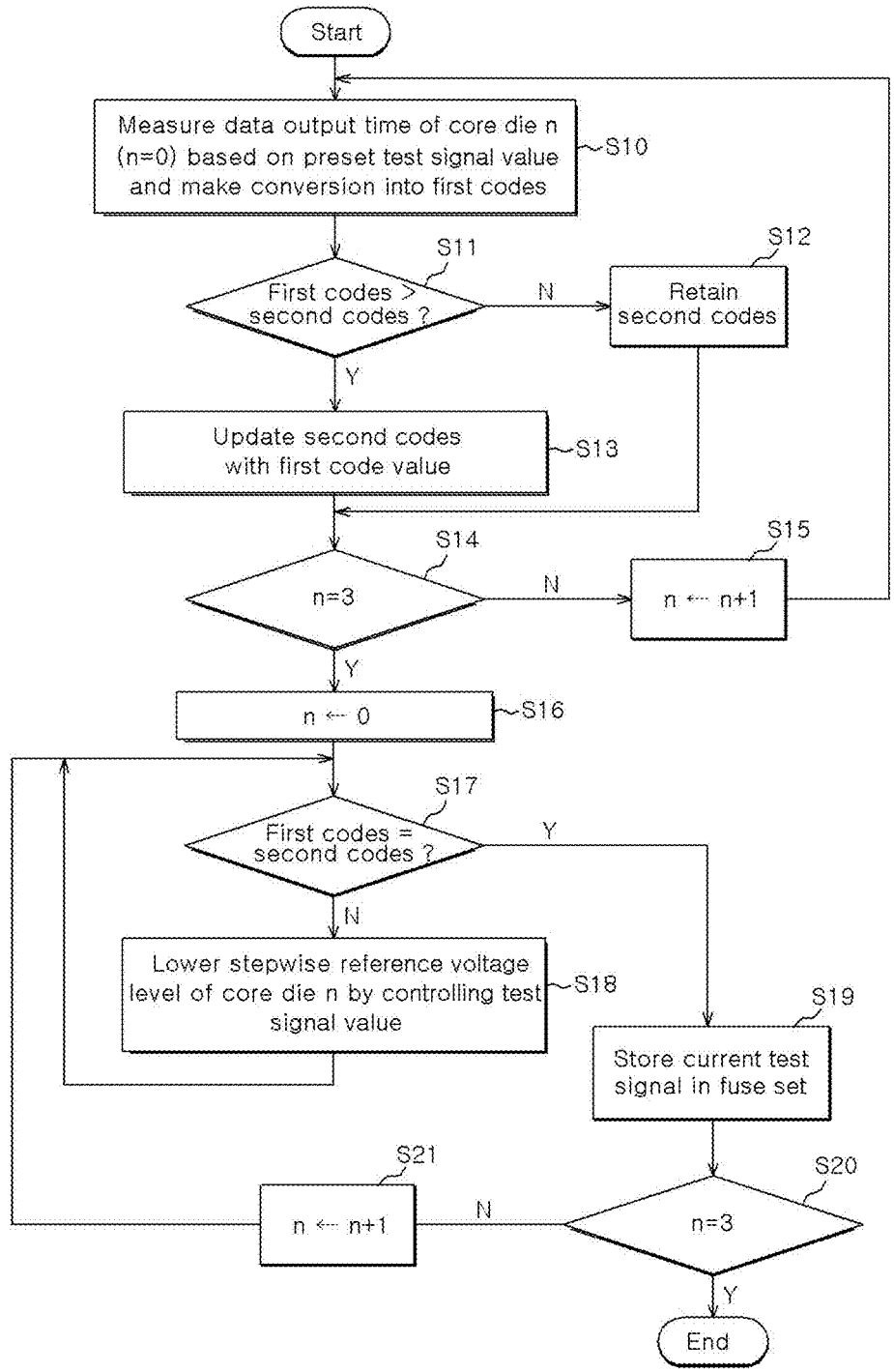
FIG. 3 is a representation of an example of a flow chart to assist in the explanation of a method for controlling the semiconductor apparatus illustrated in FIG. 2 in accordance with an embodiment.

The data output time matching operation of the semiconductor apparatus 101 in accordance with an embodiment, configured as mentioned above, will be described below with reference to FIGS. 2 and 3.

Upon entry to a test mode, the data output time of a core die n (n=0) is measured based on the test signals TM<0:n>, and is converted into the first codes CODE_DIE<4:0> (S10).

The core die 0 generates a reference voltage with a level corresponding to the value of the test signals TM<0:n>, and generates the strobe signal DQS in response to the read command RD_CMD to conform to the reference voltage level.

After the read command RD_CMD is inputted to the core die 0 and the base die 200, a time to when the strobe signal DQS is generated in the core die 0 is measured. The measured time is converted into a digital signal. The digital signal may be the first codes CODE_DIE<4:0>.

It is determined whether the first codes CODE_DIE<4:0> have a value greater than the second codes CODE_MAX<4:0> (S11).

In the examples where it is determined in the step S11 that the first codes CODE_DIE<4:0> do not have a value greater than the second codes CODE_MAX<4:0>, the subtracter 250 outputs the subtraction result signal B at a logic low level.

The second storage unit 240 retains the second codes CODE_MAX<4:0> in response to the subtraction result signal B of the logic low level (S12).

In the examples where it is determined in the step S11 that the first codes CODE_DIE<4:0> have a value greater than the second codes CODE_MAX<4:0>, the subtracter 250 outputs the subtraction result signal B at a logic high level.

The second storage unit 240 updates the second codes CODE_MAX<4:0> with the current value of the first codes CODE_DIE<4:0> in response to the subtraction result signal B of the logic high level (S13).

In an initial operation, the second codes CODE_MAX<4:0> may have a preset value, for example, the value of '00000'.

Accordingly, the second codes CODE_MAX<4:0> may be updated with the value of the first codes CODE_DIE<4:0> which are generated by measuring the data output time of the core die 0.

It is determined whether n equals 3, that is, the operation of updating the second codes CODE_MAX<4:0> is completed for all the core dies Core Die 0 to Core Die 3 (S14).

In the examples where it is determined in the step S14 that n does not equal 3, the value of n is increased by '1' (S15). In other words, an operation for generating the first codes CODE_DIE<4:0> for the core die 1 is prepared.

If n is equal to 3 by repeating the steps S10 to S15, since the operation of updating the second codes CODE_MAX<4:0> is completed for all the core dies Core Die 0 to Core Die 3, n is initialized to '0' (S16).

It is determined whether the value of the first codes CODE_DIE<4:0> generated by operating the core die n (n=0) based on the test signals TM<0:n> and the value of the second codes CODE_MAX<4:0> correspond to each other (S17).

The step S17 may be performed by the comparison unit 260.

In the examples where it is determined in the step S17 that the value of the first codes CODE_DIE<4:0> and the value of the second codes CODE_MAX<4:0> do not correspond to each other, the control signal CTRL_REF is deactivated.

If the control signal CTRL_REF is deactivated, the level of the reference voltage of the core die 0 is lowered stepwise by controlling the value of the test signals TM<0:n> (S18).

If the value of the first codes CODE_DIE<4:0> and the value of the second codes CODE_MAX<4:0> correspond to each other by repeating the steps S17 and S18, the control signal CTRL_REF is activated.

If the control signal CTRL_REF is activated, the current value of the test signals TM<0:n> is stored in the fuse set of the core die 0 (S19).

It is determined whether n is equal to 3, that is, the operation of storing the value of the test signals TM<0:n> in a fuse set is completed for all the core dies Core Die 0 to Core Die 3 (S20).

In the examples where it is determined in the step S20 that n is not equal to 3, the value of n is increased by '1' (S21), and the steps S17 to S21 are repeated.

In the examples where it is determined in the step S20 that n is equal to 3, the operation of storing the value of the test signals TM<0:n> in a fuse set is completed for all the core dies Core Die 0 to Core Die 3.

Through the above steps S10 to S21, the values of the first codes CODE_DIE<4:0> of all the core dies Core Die 0 to Core Die 3 may become equal to the value of the second codes CODE_MAX<4:0> which are finally updated before the step S16.

Namely, through the above steps S10 to S21, the data output times of all the core dies Core Die 0 to Core Die 3 may be controlled to be equal to one another.

Thereafter, all the core dies Core Die 0 to Core Die 3 may generate reference voltages, based on the values stored in the respective fuse sets thereof, in a normal mode operation.

In an embodiment, by independently controlling the reference voltage levels of the core dies Core Die 0 to Core Die 3 in conformity with the PVT characteristics of the respective core dies Core Die 0 to Core Die 3, internal bias levels may be controlled, and accordingly, all the core dies Core Die 0 to Core Die 3 may have the same data output times with respect to the read command RD_CMD.

Figure 4:
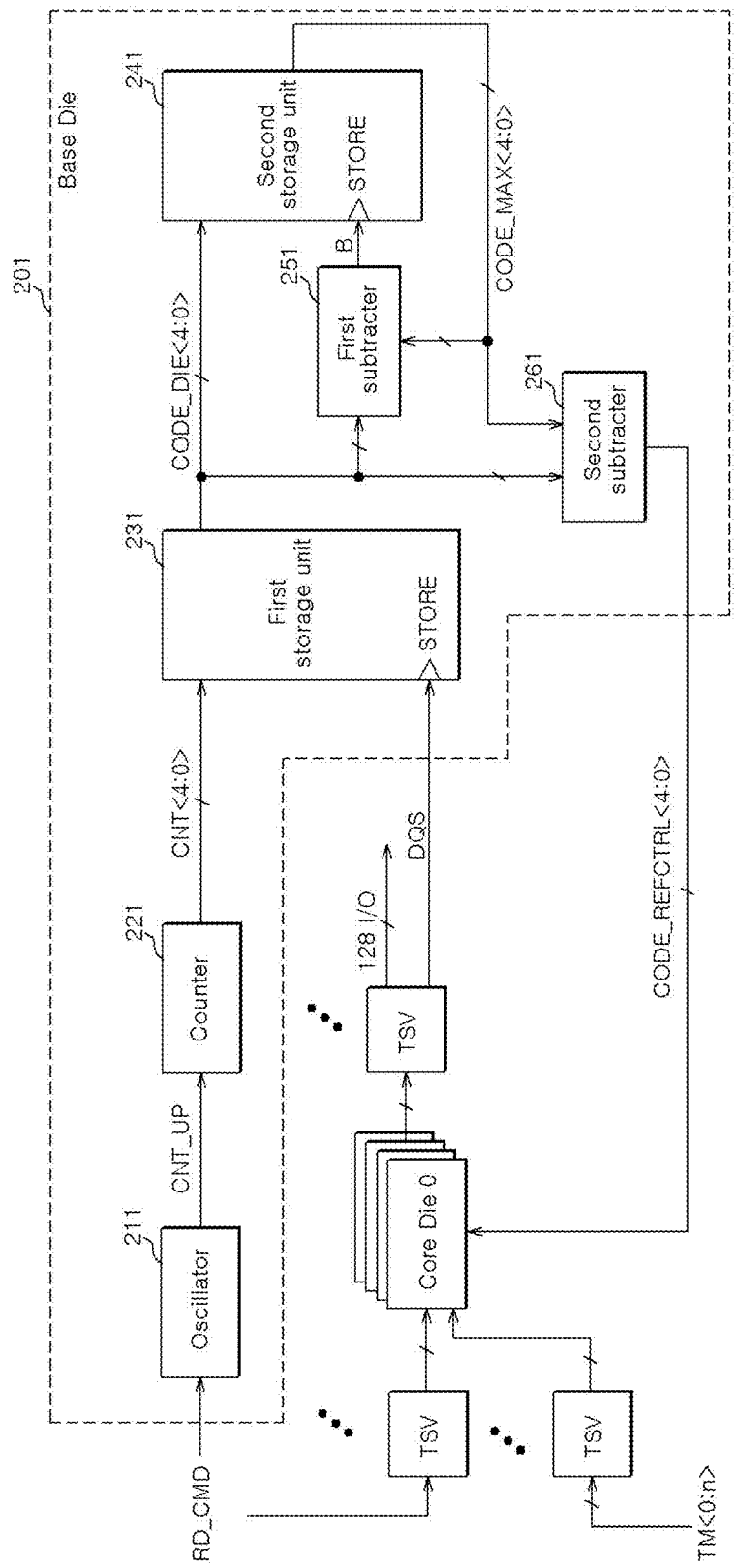
FIG. 4 is a block diagram illustrating a representation of an example of the internal configuration of a semiconductor apparatus in accordance with an embodiment.

Referring to FIG. 4, a semiconductor apparatus 102 in accordance with an embodiment may include a base die 201 and core dies Core Die 0 to Core Die 3.

The base die 201 may be configured to generate control codes CODE_REFCTRL<4:0> corresponding to difference values between any one, that is, the longest data output time, among the data output times of the core dies Core Die 0 to Core Die 3 detected in response to a read command RD_CMD and a strobe signal DQS, and the remaining data output times.

The core dies Core Die 0 to Core Die 3 may be configured to output data through input/output lines 128 I/O. The data may be output through the input/output lines 128 I/O in response to the read command RD_CMD.

Each of the core dies Core Die 0 to Core Die 3 may be configured to output the strobe signal DQS for notifying a data output time, according to the reference voltage controlled by test signals TM<0:n>, in response to the read command RD_CMD.

Each of the core dies Core Die 0 to Core Die 3 may generate a reference voltage with a level corresponding to reference codes in a normal operation. Each of the core dies Core Die 0 to Core Die 3 may generate a reference voltage with a level corresponding to the value of the test signals TM<0:n> in a test operation.

The reference codes may be stored in a fuse set.

Each of the core dies Core Die 0 to Core Die 3 may be configured to update a value that results from subtracting the control codes CODE_REFCTRL<4:0> from the test signals TM<0:n>, as the reference codes.

The base die 201 and the core dies Core Die 0 to Core Die 3 may be electrically coupled such that signal transmission is implemented through vias, for example, through-silicon vias (TSV).

The base die 201 may include an oscillator 211, a counter 221, and a first storage unit 231. The base die 201 may include a second storage unit 241, a first subtracter 251, and a second subtracter 261.

The oscillator 211 may be configured to output the oscillation signal. The oscillation signal may be generated in response to the read command RD_CMD, as a count-up signal CNT_UP.

The counter 221 may be configured to change, that is, increase the value of time count signals CNT<4:0> in response to the count-up signal CNT_UP.

The counter 221 may be configured to increase the value of the time count signals CNT<4:0> each time the count-up signal CNT_UP is generated.

The first storage unit 231 may be configured to store the time count signals CNT<4:0>, as first codes CODE_DIE<4:0>. The time count signals CNT<4:0> may be stored as first codes CODE_DIE<4:0> in response to the input signal of a control terminal STORE. The input signal of the control terminal may be the strobe signal DQS.

The first storage unit 231 may be configured to store the time count signals CNT<4:0> at a timing when the strobe signal DQS is generated, that is, the transition (for example, the rising edge) of the strobe signal DQS occurs, and the first storage unit 231 outputs stored values as the first codes CODE_DIE<4:0>.

The first codes CODE_DIE<4:0> are digital values that result from converting the data output time of each of the core dies Core Die 0 to Core Die 3, that is, a time that passes from a timing when the read command RD_CMD is inputted to a timing when the transition of the strobe signal DQS occurs.

The second storage unit 241 may be configured to update second codes CODE_MAX<4:0>. The second codes CODE_MAX<4:0> may be updated with the currently inputted value of the first codes CODE_DIE<4:0> in response to the input signal of a control terminal STORE. The input signal may be a subtraction result signal B.

The second storage unit 241 may retain the current second codes CODE_MAX<4:0> in the examples where the subtraction result signal B is deactivated (for example, when B is at a logic low level).

The second storage unit 241 may update the second codes CODE_MAX<4:0> with the currently inputted value of the first codes CODE_DIE<4:0> in the examples where the subtraction result signal B is activated (for example, when B is at a logic high level).

The first subtracter 251 may be configured to subtract the first codes CODE_DIE<4:0> from the second codes CODE_MAX<4:0>, and generate the subtraction result signal B.

The first subtracter 251 may be configured to output a borrowed value as the subtraction result signal B in the examples where the value of the first codes CODE_DIE<4:0> is greater than the value of the second codes CODE_MAX<4:0>, in the course of subtracting the first codes CODE_DIE<4:0> from the second codes CODE_MAX<4:0> starting from the most significant bit.

The second codes CODE_MAX<4:0> may be a maximum value among the first codes CODE_DIE<4:0> according to the respective core dies Core Die 0 to Core Die 3.

The second subtracter 261 may be configured to output a difference value that results from subtracting the first codes CODE_DIE<4:0> from the second codes CODE_MAX<4:0>, as the control codes CODE_REFCTRL<4:0>.

Figure 5:
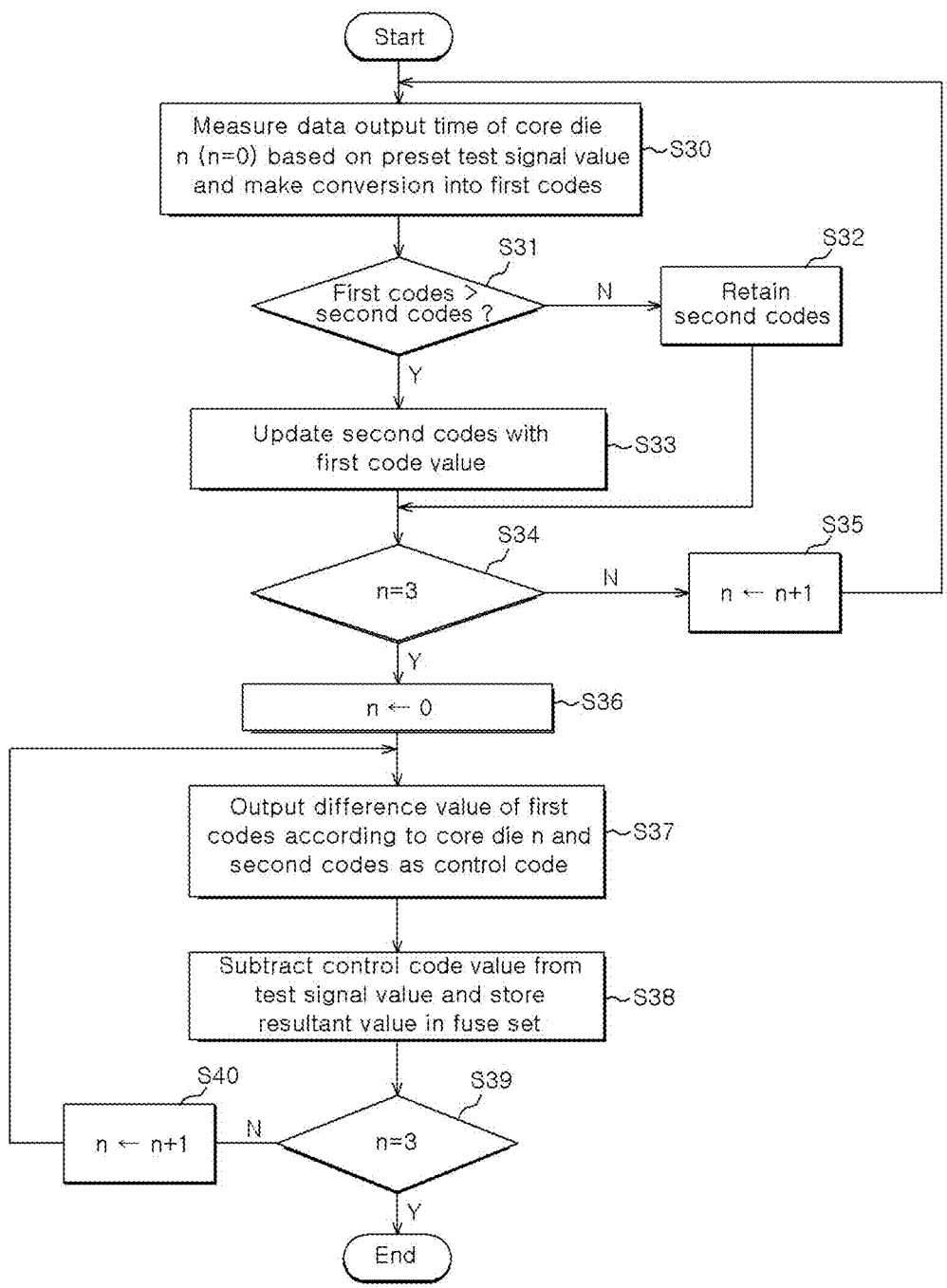
FIG. 5 is a representation of an example of a flow chart to assist in the explanation of a method for controlling the semiconductor apparatus illustrated in FIG. 4 in accordance with an embodiment.

The data output time matching operation of the semiconductor apparatus 102 in accordance with an embodiment, configured as mentioned above, will be described below with reference to FIGS. 4 and 5.

Upon entry to a test mode, the data output time of a core die n (n=0) is measured based on the test signals TM<0:n>, and is converted into the first codes CODE_DIE<4:0> (S30).

The core die 0 generates a reference voltage with a level corresponding to the value of the test signals TM<0:n>, and generates the strobe signal DQS in response to the read command RD_CMD to conform to the reference voltage level.

After the read command RD_CMD is inputted to the core die 0 and the base die 201, a time to when the strobe signal DQS is generated in the core die 0 is measured. The measured time is converted into a digital signal. The digital signal may be the first codes CODE_DIE<4:0>.

It is determined whether the first codes CODE_DIE<4:0> have a value greater than the second codes CODE_MAX<4:0> (S31).

In the examples where it is determined in the step S31 that the first codes CODE_DIE<4:0> do not have a value greater than the second codes CODE_MAX<4:0>, the first subtracter 251 outputs the subtraction result signal B at a logic low level.

The second storage unit 241 retains the second codes CODE_MAX<4:0> in response to the subtraction result signal B of the logic low level (S32).

In the examples where it is determined in the step S31 that the first codes CODE_DIE<4:0> have a value greater than the second codes CODE_MAX<4:0>, the first subtracter 251 outputs the subtraction result signal B at a logic high level.

The second storage unit 241 updates the second codes CODE_MAX<4:0> with the current value of the first codes CODE_DIE<4:0> in response to the subtraction result signal B of the logic high level (S33).

In an initial operation, the second codes CODE_MAX<4:0> may have a preset value, for example, the value of '00000'.

Accordingly, the second codes CODE_MAX<4:0> may be updated with the value of the first codes CODE_DIE<4:0> which are generated by measuring the data output time of the core die 0.

It is determined whether n equals 3, that is, the operation of updating the second codes CODE_MAX<4:0> is completed for all the core dies Core Die 0 to Core Die 3 (S34).

In the examples where it is determined in the step S34 that n does not equal 3, the value of n is increased by '1' (S35). In other words, an operation for generating the first codes CODE_DIE<4:0> for the core die 1 is prepared.

If n is equal to 3 by repeating the steps S30 to S35, since the operation of updating the second codes CODE_MAX<4:0> is completed for all the core dies Core Die 0 to Core Die 3, n is initialized to '0' (S36).

The difference value between the first codes CODE_DIE<4:0> generated by operating the core die n (n=0) based on the test signals TM<0:n> and the second codes CODE_MAX<4:0> is outputted as the control codes CODE_REFCTRL<4:0> (S37).

The step S37 may be performed by the second subtracter 261.

A value that results from subtracting the value of the control codes CODE_REFCTRL<4:0> from the value of the test signals TM<0:n> inputted to the core die 0 is stored in the fuse set of the core die 0 (S38).

It is determined whether n equals 3, that is, a fuse set storage operation is completed for all the core dies Core Die 0 to Core Die 3 (S39).

In the examples where it is determined in the step S39 that n is not equal to 3, the value of n is increased by '1' (S40), and the steps S37 to S40 are repeated.

In the examples where it is determined in the step S39 that n is equal to 3, the fuse set storage operation is completed for all the core dies Core Die 0 to Core Die 3.

Through the above steps S30 to S40, the differences between the values of the first codes CODE_DIE<4:0> and the values of the second codes CODE_MAX<4:0> of all the core dies Core Die 0 to Core Die 3 may be compensated for.

Namely, through the above steps S30 to S40, the data output times of all the core dies Core Die 0 to Core Die 3 may be controlled to be equal to one another.

Thereafter, all the core dies Core Die 0 to Core Die 3 may generate reference voltages, based on the values stored in the respective fuse sets thereof, in a normal mode operation.

In an embodiment, by independently controlling the reference voltage levels of the core dies Core Die 0 to Core Die 3 in conformity with the PVT characteristics of the respective core dies Core Die 0 to Core Die 3, internal bias levels may be controlled, and accordingly, all the core dies Core Die 0 to Core Die 3 may have the same data output times with respect to the read command RD_CMD.

Figure 6:
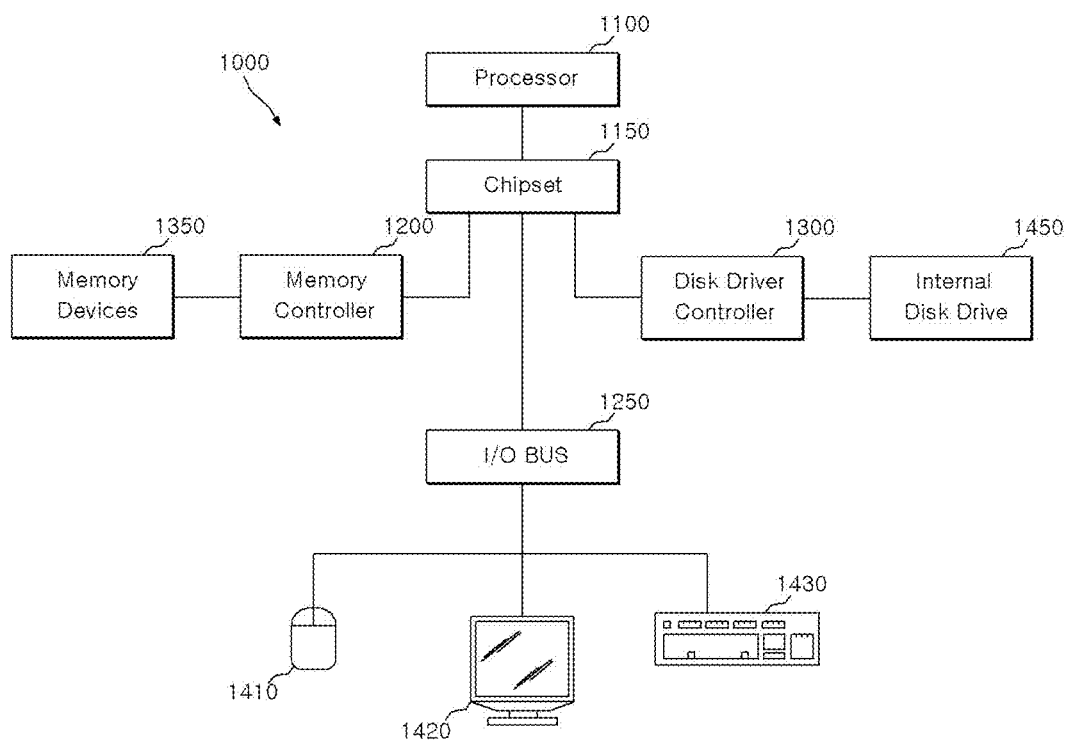
FIG. 6 illustrates a block diagram of an example of a representation of a system employing the semiconductor apparatus and method in accordance with the embodiments discussed above with relation to Fins.

The semiconductor apparatuses and methods discussed above (see FIGS. 1-5) are particular useful in the design of memory devices, processors, and computer systems. For example, referring to FIG. 6, a block diagram of a system employing the semiconductor apparatuses and methods in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor apparatus as discussed above with reference to FIGS. 1-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus as discussed above with relation to FIGS. 1-5, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the semiconductor apparatus and/or method as discussed above with relation to FIGS. 1-5. In alternate embodiments, such as cellular phones or digital cameras, the components may differ from the embodiments illustrated in FIG. 6.

While various embodiments have been described above, it will be understood to those skilled in the art that the embodiments described are by way of example only. Accordingly, the semiconductor apparatus capable of compensating for a data output time and the method for controlling the same described herein should not be limited based on the described embodiments.

What is claimed is:

1. A semiconductor apparatus including:
   a base die; and
   a plurality of core dies stacked above the base die,
   wherein each of the core dies is configured to output a strobe signal in response to a read command, and
   wherein the base die is configured to detect a time from input of the read command to a transition of the strobe signal as respective data output times of the plurality of core dies, and match remaining data output times to any one data output time among the respective data output times of the plurality of core dies.

2. The semiconductor apparatus according to claim 1, wherein the any one data output time is a longest data output time among the respective data output times of the plurality of core dies.

3. The semiconductor apparatus according to claim 1, wherein the base die is configured to match the remaining data output times to the any one data output time among the respective data output times of the plurality of core dies by controlling respective internal bias levels of the plurality of core dies.

4. The semiconductor apparatus according to claim 3, wherein the controlling of the respective internal bias levels of the plurality of core dies is implemented by controlling respective reference voltage levels of the plurality of core dies.

5. A semiconductor apparatus including:
   a base die; and
   a plurality of core dies stacked above the base die,
   wherein each of the plurality of core dies is configured to output a strobe signal for notifying a data output timing, in response to a test signal and a read command,
   wherein the base die is configured to detect a time from input of the read command to a transition of the strobe signal as respective data output times of the plurality of core dies, and generate a control signal for notifying whether any one data output time and the remaining data output times among the respective data output times of the plurality of core dies, correspond to each other.

6. The semiconductor apparatus according to claim 5, wherein each of the plurality of core dies is configured to be controlled in a reference voltage according to reference codes stored therein, in a normal operation, and be controlled in the reference voltage according to the test signal in a test operation.

7. The semiconductor apparatus according to claim 5, wherein each of the plurality of core dies is configured to store the corresponding test signal as the reference codes for setting the reference voltage, at an activation timing of the control signal.

8. The semiconductor apparatus according to claim 5, wherein the base die comprises:
   a first storage unit configured to store a time count signal resulting from counting a time that passes from a timing when the read command is inputted, as first codes in response to the strobe signal;
   a second storage unit configured to update second codes with a value of the first codes, in response to a subtraction result signal;
   a subtracter configured to subtract the first codes from the second codes, and generate the subtraction result signal; and
   a comparison unit configured to compare the first codes and the second codes, and generate the control signal.

9. The semiconductor apparatus according to claim 8, further comprising:
   an oscillator configured to output an oscillation signal generated in response to the read command, as a count-up signal; and
   a counter configured to increase a value of the time count signal in response to the count-up signal.

10. A semiconductor apparatus including:
    a base die; and
    a plurality of core dies stacked above the base die,
    wherein each of the plurality of core dies is configured to output a strobe signal for notifying a data output timing, in response to a test signal and a read command,
    wherein the base die is configured to detect a time from input of the read command to a transition of the strobe signal as respective data output times of the plurality of core dies, and generate control codes corresponding to a difference value between any one data output time and the remaining data output times among the respective data output times of the plurality of core dies.

11. The semiconductor apparatus according to claim 10, wherein each of the plurality of core dies is configured to be controlled in a reference voltage according to reference codes stored therein, in a normal operation, and be controlled in the reference voltage according to the test signal in a test operation.

12. The semiconductor apparatus according to claim 10, wherein each of the plurality of core dies is configured to update a value that results from subtracting the control codes from the test signal, as the reference codes for setting the reference voltage.

13. The semiconductor apparatus according to claim 10, wherein the base die comprises:
    a first storage unit configured to store a time count signal resulting from counting a time that passes from a timing when the read command is inputted, as first codes in response to the strobe signal;
    a second storage unit configured to update second codes with a value of the first codes, in response to a subtraction result signal;
    a first subtracter configured to subtract the first codes from the second codes, and generate the subtraction result signal; and
    a second subtracter configured to output a difference value that results from subtracting the first codes from the second codes, as the control codes.

14. The semiconductor apparatus according to claim 13, further comprising:
    an oscillator configured to output an oscillation signal generated in response to the read command, as a count-up signal; and
    a counter configured to increase a value of the time count signal in response to the count-up signal.

15. A method for controlling a semiconductor apparatus including:
    a base die; and
    a plurality of core dies stacked above the base die, the method comprising:
    measuring, sequentially, respective data output times of the plurality of core dies, and storing a maximum value among the measured data output times; and
    controlling independently respective internal bias levels of the plurality of core dies according to differences between the respective data output times of the plurality of core dies and the maximum value.

16. The method according to claim 15, wherein the measuring of data output times comprises:
inputting a read command to the plurality of core dies; and
counting times from a timing when the read command is inputted to timings when strobe signals for notifying data output timings are outputted from the plurality of core dies.

17. The method according to claim 15, wherein the controlling comprises:
lowering stepwise reference voltages of core dies of which data output times are shorter than the maximum value; and
repeating the lowering until the data output times of the core dies which are shorter than the maximum value become equal to the maximum value.

18. The method according to claim 15, wherein the controlling is performed by controlling the respective reference voltages of the plurality of core dies according to differences between the respective data output times of the plurality of core dies and the maximum value.

19. The method according to claim 15, wherein each of the plurality of core dies is controlled in the reference voltage according to reference codes stored therein, in a normal operation, and is controlled in the reference voltage according to a test signal in a test operation.

20. The method according to claim 19, wherein the controlling comprises:
lowering stepwise reference voltages of core dies of which data output times are shorter than the maximum value, by using the test signal; and
storing the test signal when each of the data output times of the core dies which are shorter than the maximum value becomes equal to the maximum value, as the reference codes.

21. The method according to claim 19, wherein the controlling is performed by storing a value that results from subtracting each of differences between the data output times of the core dies which are shorter than the maximum value and the maximum value, from a value of the test signal, as the reference codes.

* * * * *